US011092860B1

(12) United States Patent
Lu et al.

(10) Patent No.: US 11,092,860 B1
(45) Date of Patent: Aug. 17, 2021

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Yantao Lu, Hubei (CN); Guanghui Liu, Hubei (CN); Chao Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 88 days.

(21) Appl. No.: 16/631,298

(22) PCT Filed: Jul. 18, 2019

(86) PCT No.: PCT/CN2019/096488
§ 371 (c)(1),
(2) Date: Jan. 15, 2020

(87) PCT Pub. No.: WO2020/211200
PCT Pub. Date: Oct. 22, 2020

(30) Foreign Application Priority Data

Apr. 15, 2019 (CN) .......................... 201910301415.5

(51) Int. Cl.
*H05K 1/00* (2006.01)
*G02F 1/1345* (2006.01)
(Continued)

(52) U.S. Cl.
CPC ...... *G02F 1/13452* (2013.01); *G02F 1/13456* (2021.01); *H01L 23/544* (2013.01); *H01L 25/18* (2013.01); *H01L 27/1218* (2013.01); *H05K 1/189* (2013.01); *G02F 2201/56* (2013.01); *H01L 2223/54426* (2013.01); *H01L 2223/54433* (2013.01); *H05K 2201/056* (2013.01);
(Continued)

(58) Field of Classification Search
CPC ............. G02F 1/13452; G02F 1/13456; G02F 2201/56; H01L 23/544; H01L 25/18; H01L 27/1218; H01L 2223/54426; H01L 2223/54433; H05K 2201/10136; H05K 2201/056; H05K 2201/09027
See application file for complete search history.

(56) References Cited

U.S. PATENT DOCUMENTS 10,568,218 B1* 2/2020 Xu .......................... H05K 1/189
2015/0211707 A1* 7/2015 Watanabe ............. G02F 1/1339
345/667

(Continued)

*Primary Examiner* — Yuriy Semenenko

(57) ABSTRACT

The disclosure provides a display panel and a display device. In an array substrate of the display panel, at least two protrusions are defined on a side of a non-display region away from a display region to form an extending portion. A recess is defined between adjacent protrusions. A driver chip is disposed in a space between a periphery of a display region and a periphery of a non-display region. Distances between the driver chip, the periphery of the display region, and the periphery of the non-display region are increased. A bending section of a flexible circuit board is disposed in the recess. As a result, width of the non-display region will not be increased.

20 Claims, 13 Drawing Sheets

(51) Int. Cl.
  *H01L 25/18* (2006.01)
  *H01L 27/12* (2006.01)
  *H05K 1/18* (2006.01)
  *H01L 23/544* (2006.01)
(52) U.S. Cl.
  CPC .............. *H05K 2201/09027* (2013.01); *H05K 2201/10136* (2013.01)

(56) References Cited

U.S. PATENT DOCUMENTS

| | | | |
|---|---|---|---|
| 2019/0129217 A1* | 5/2019 | Wang | G02F 1/13452 |
| 2019/0252411 A1* | 8/2019 | Lee | H01L 27/124 |
| 2019/0267434 A1* | 8/2019 | Liu | G06F 1/1637 |
| 2020/0209470 A1* | 7/2020 | Li | G02B 6/12004 |
| 2021/0028263 A1* | 1/2021 | Tsai | H01L 27/3276 |
| 2021/0029829 A1* | 1/2021 | Liu | G06F 3/147 |
| 2021/0072599 A1* | 3/2021 | Mei | G09G 3/3406 |
| 2021/0075121 A1* | 3/2021 | Li | H01Q 1/08 |

\* cited by examiner

DISPLAY PANEL AND DISPLAY DEVICE

FIELD

The present disclosure relates to the field of display technology and, more particularly, relates to a display panel and a display device.

BACKGROUND

With the development of full-screen displays, screen-to-body ratio of display panels becomes increasingly greater, while non-display regions of display devices, such as a bottom bezel, become smaller and smaller. As shown in FIG. 1, a distance d between the bottom bezel and a periphery of a display region is continuously decreasing.

Because electrical components such as a driver chip, wires, and terminals need to be disposed in a non-display region, sufficient space must be reserved for ensuring that the electrical components can work normally. The distance between the bottom bezel and the periphery of the display region cannot be less than a predetermined value. A setting way of conventional display panels cannot meet a developing trend of full-screen display technology.

That is, a technical problem that the conventional display panels cannot meet the developing trend of full-screen display technology is desired to be improved.

SUMMARY

The present disclosure provides a display panel and a display device to alleviate a technical problem that the conventional display panels cannot meet a developing trend of full-screen display technology.

To solve the above problem, a technical solution provided by the present disclosure are as follows:

An embodiment of the present disclosure provides a display panel, including: an array substrate; a driver chip; and a flexible circuit board; wherein the array substrate includes a display region and a non-display region. The driver chip and the flexible circuit board are bonded to a side of the non-display region. At least two protrusions are defined on a side of the non-display region away from the display region, and a recess is defined between adjacent protrusions. A partial section of the flexible circuit board is bent to a backside of the array substrate along an edge of the recess, and the driver chip is deposed between an edge of the non-display region and an edge of the display region.

In the display panel provided by an embodiment of the present disclosure, each of the protrusions includes at least one first protrusion and at least one second protrusion. The driver chip is disposed between an edge of the first protrusion and the edge of the display region.

In the display panel provided by an embodiment of the present disclosure, the driver chip is disposed outside the first protrusion, or is completely or partially disposed in the first protrusion.

In the display panel provided by an embodiment of the present disclosure, shapes of the protrusions include one or more of a rectangle, a trapezoid, a circular arc, or a triangle.

In the display panel provided by an embodiment of the present disclosure, a gate driver on array (GOA) wire is disposed in the array substrate, the GOA wire includes a tilt section located in the non-display region and toward the driver chip, and the tilt section of the GOA wire is connected to the driver chip. A plurality of signal terminal groups are disposed in the non-display region and are configured to connect with the flexible circuit board.

In the display panel provided by an embodiment of the present disclosure, each of the signal terminal groups includes a main signal terminal group and a secondary signal terminal group. The main signal terminal group is disposed between the secondary signal terminal group and the driver chip.

In the display panel provided by an embodiment of the present disclosure, the secondary signal terminal group and the main signal terminal group are spaced from each other, the main signal terminal group is completely or partially disposed in the first protrusion, and the secondary signal terminal group is disposed outside the first protrusion.

In the display panel provided by an embodiment of the present disclosure, the flexible circuit board includes a main section and a connecting section. The connecting section includes a first block correspondingly connected to the main signal terminal group and a second block correspondingly connected to the secondary signal terminal group. The first block and the second block are disposed alternatively.

In the display panel provided by an embodiment of the present disclosure, each of the signal terminal groups further includes a virtual terminal group. The virtual terminal group is disposed on a side of the secondary signal terminal group away from the driver chip and the tilt section of the GOA wire.

In the display panel provided by an embodiment of the present disclosure, the non-display region further includes a testing terminal group, a converting terminal group, and an identification terminal group. At least one of the testing terminal group, the converting terminal group, or the identification terminal group is disposed between an edge of the second protrusion and an edge of the display region.

In the display panel provided by an embodiment of the present disclosure, the testing terminal group, the converting terminal group, and the identification terminal group are disposed in at least two rows.

An embodiment of the present disclosure provides a display device, including a display panel. The display panel includes an array substrate; a driver chip; and a flexible circuit board. The array substrate includes a display region and a non-display region. The driver chip and the flexible circuit board are bonded to a side of the non-display region. At least two protrusions are defined on a side of the non-display region away from the display region, and a recess is defined between two adjacent protrusions. A partial section of the flexible circuit board is bent to a backside of the array substrate along an edge of the recess, and the driver chip is deposed between an edge of the non-display region and the edge of the display region.

In the display device provided by an embodiment of the present disclosure, each of the protrusions includes at least one first protrusion and at least one second protrusion. The driver chip is disposed between an edge of the first protrusion and an edge of the display region.

In the display device provided by an embodiment of the present disclosure, the driver chip is disposed outside the first protrusion. The driver chip is completely or partially disposed in the first protrusion.

In the display device provided by an embodiment of the present disclosure, shapes of the protrusions include one or more of a rectangle, a trapezoid, a circular arc, or a triangle.

In the display device provided by an embodiment of the present disclosure, a gate driver on array (GOA) wire is disposed in the array substrate, the GOA wire includes a tilt section located in the non-display region and toward the driver chip. The tilt section of the GOA wire is connected to the driver chip. A plurality of signal terminal groups are disposed in the non-display region and are configured to connect with the flexible circuit board.

In the display device provided by an embodiment of the present disclosure, each of the signal terminal groups includes a main signal terminal group and a secondary signal terminal group. The main signal terminal group is disposed between the secondary signal terminal group and the driver chip.

In the display device provided by an embodiment of the present disclosure, the secondary signal terminal group and the main signal terminal group are spaced from each other. The main signal terminal group is completely or partially disposed in the first protrusion, and the secondary signal terminal group is disposed outside the first protrusion.

In the display device provided by an embodiment of the present disclosure, the flexible circuit board includes a main section and a connecting section. The connecting section includes a first block correspondingly connected to the main signal terminal group and a second block correspondingly connected to the secondary signal terminal group. The first block and the second block are disposed alternatively.

In the display device provided by an embodiment of the present disclosure, each of the signal terminal groups further includes a virtual terminal group. The virtual terminal group is disposed on a side of the secondary signal terminal group away from the driver chip and the tilt section of the GOA wire.

Regarding beneficial effects of the present disclosure: the present disclosure provides a display panel and a display device. In an array substrate of the display panel, at least two protrusions are defined on a side of a non-display region away from a display region to form an extending portion. A recess is defined between adjacent protrusions. Compared to conventional display panels, in the display panel provided by the present disclosure, a driver chip is disposed in a space between a periphery of the display region and a periphery of the non-display region. Distances between the driver chip, the periphery of the display region, and the periphery of the non-display region are increased, which prevent technical defects following a pressing process of the driver chip, such as poor electrical property of the driver chip and improperly sealed liquid crystal cell, which are caused by the driver chip being excessively close to the periphery of the display region and a periphery of a substrate due to a compression of the non-display region in a high screen-to-body ratio display panel. Furthermore, a bending section of a flexible circuit board is disposed in the recess between two adjacent protrusions. A bending radius of the bending section does not overstep peripheries of the protrusions. As a result, a width of the non-display region will not be increased, screen-to-body ratio of a display device can be kept, and a technical problem that conventional display panels cannot meet a developing trend of full-screen display technology can be alleviated.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which those skilled in the art can derive further figures without making any inventive efforts.

DETAILED DESCRIPTION

Figure 1:
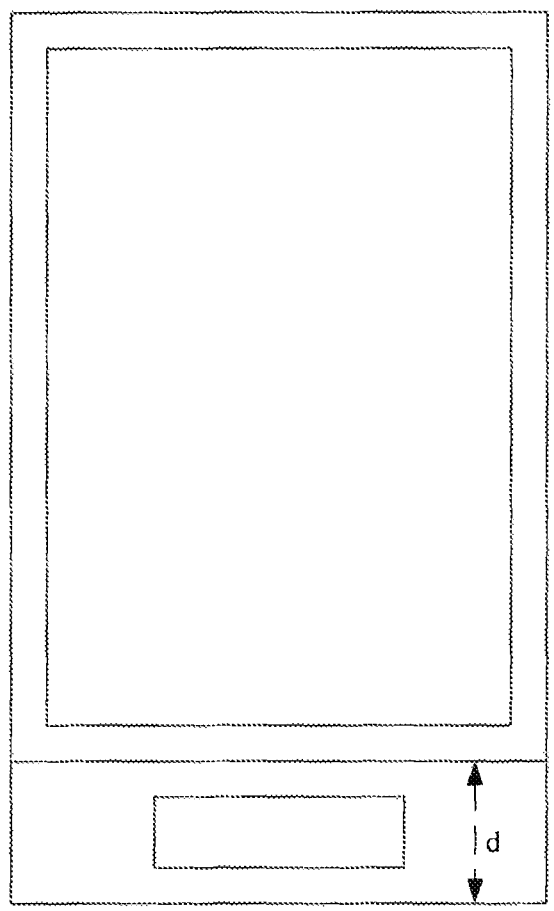
FIG. 1 is a schematic diagram of a conventional display panel.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

Embodiments of the present disclosure can alleviate a technical problem that conventional display panels cannot meet a developing trend of full-screen display panels.

Figure 2:
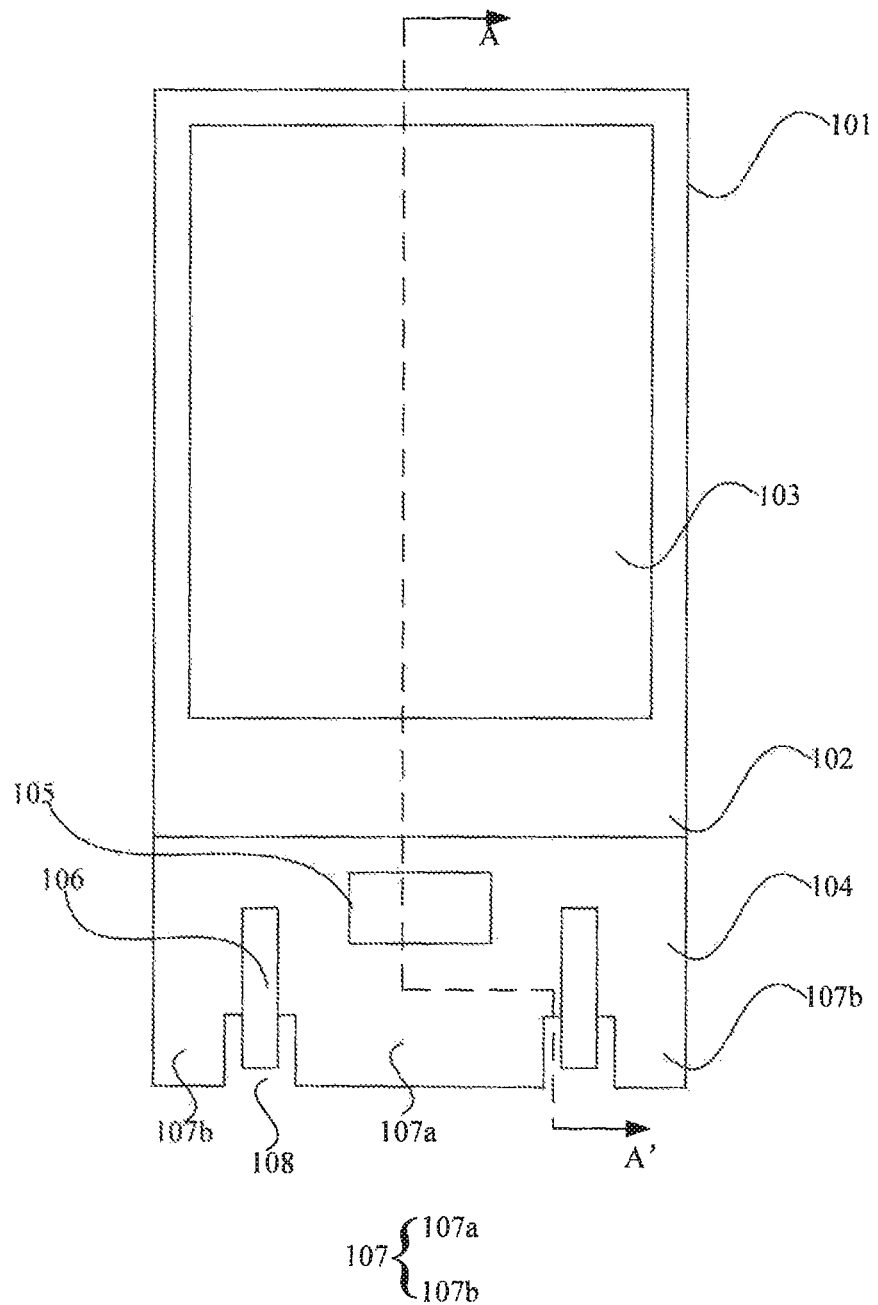
FIG. 2 is a structural view of a display panel according to an embodiment the present disclosure.
Figure 3:
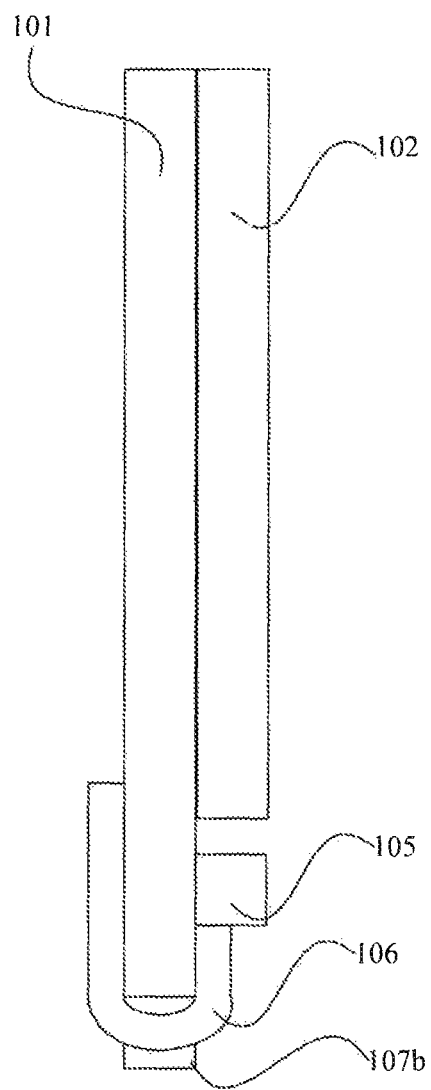
FIG. 3 is a schematic cross-sectional view of a display panel taken along line A-A' according to an embodiment of the present disclosure.

As shown in FIG. 2 and FIG. 3, the present disclosure provides a display panel, including an array substrate 101 and a color filter 102 disposed corresponding to the array substrate 101. A display region 103 is disposed on a surface of the array substrate 101 and is confined by a frame sealant. A liquid crystal layer is confined by the frame sealant. The color filter 102 and the array substrate 101 are combined by the frame sealant.

Regions between the display region 103 and a periphery of the array substrate 101 form a non-display region 104. A plurality of signal wires are distributed in the non-display region 104. Other electrical components like a driver chip 105 and a flexible circuit board 106 are bonded to the non-display region 104.

A length of the color filter 102 is less than that of the array substrate 101, and a height of the color filter 102 is greater than that of the array substrate 101. A region between a projection of a bottom periphery of the color filter 102 on the surface of the array substrate 101 and a periphery of the array substrate 101 forms a staircase region. The staircase region is in the non-display region 104. The driver chip 105, the flexible circuit board 106, and other electrical components are disposed on a side of the non-display region 104. In other words, the signal wires extend from the staircase region to the entire non-display region 104 and the entire display region 103.

When a motherboard of the display panel is cut, at least two protrusions 107 are reserved on a side of the array substrate 101 away from the display region 103. A recess 108 is defined between adjacent protrusions 107. The driver chip 105 is disposed on a bottom periphery of the protrusion 107, that is, the driver chip 105 is disposed between a periphery of the non-display region 104 and a periphery of the display region 103. Therefore, a height difference between a top of the driver chip 105 and a periphery of the display region 103 is increased, and a height difference between a bottom of the driver chip 105 and a bottom periphery of the protrusion 107 is also increased.

In one embodiment, the protrusion 107 includes at least one first protrusion 107a and at least one second protrusion 107b. The first protrusion 107a is disposed on a middle portion of a side of the array substrate 101. The driver chip 105 is disposed between a bottom periphery of the first protrusion 107a and a periphery of the display region 103.

The flexible circuit board 106 includes a connecting section connected to the non-display region 104, a main section bent to a backside of the display panel, and a bending section for connecting the connecting section with the main section. The bending section is bent to a backside of the array substrate with respect to a periphery of the recess 108. That is, the bending section is disposed in the recess 108. A bending radius of the bending section is less than or equal to a height of the first protrusion 107a, that is, the bending section does not overstep the recess 108.

In one embodiment, the bending section is bent with respect to a periphery of the recess 108 beside at least one side of the first protrusion 107a. The bending section may also be bent with respect to a periphery of the recess 108 beside at least one side of the second protrusion 107b.

In an embodiment of the present disclosure, the first protrusion 107a is disposed according to the amount of the driver chip 105. A position of the first protrusion 107a and the driver chip are not limited to a middle portion of the non-display region 104. For example, the first protrusion 107a may also be disposed near any side of the non-display region 104.

In an embodiment of the present embodiment, the second protrusion 107b is disposed according to the amount of the first protrusion 107a, and is configured to enlarge a contact area between the protrusion 107 and a cage of a display device. As a result, forces applied to the display panel can be uniform. The second protrusion 107b and the first protrusion 107a are not limited to a manner of staggered arrangement.

In an embodiment of the present disclosure, the second protrusion 107b may only have a supporting function, and no electrical component is disposed on the second protrusion 107b. However, electrical components required for the display panel, such as a converting terminal, or electrical components that the display panel does not require, such as a fingerprint identification device and a camera, may also be disposed on the second protrusion 107b.

Consequently, compared to conventional display panels, spaces near a top side and a bottom side of the driver chip 105 are broadened in an embodiment of the present disclosure, while an entire height of the non-display region 104 is not increased. The present disclosure not only solves the problem that spaces near the top side and the bottom side of the driver chip 105 are too narrow, but also retains a narrow non-display region of the conventional display panels.

Figure 4:
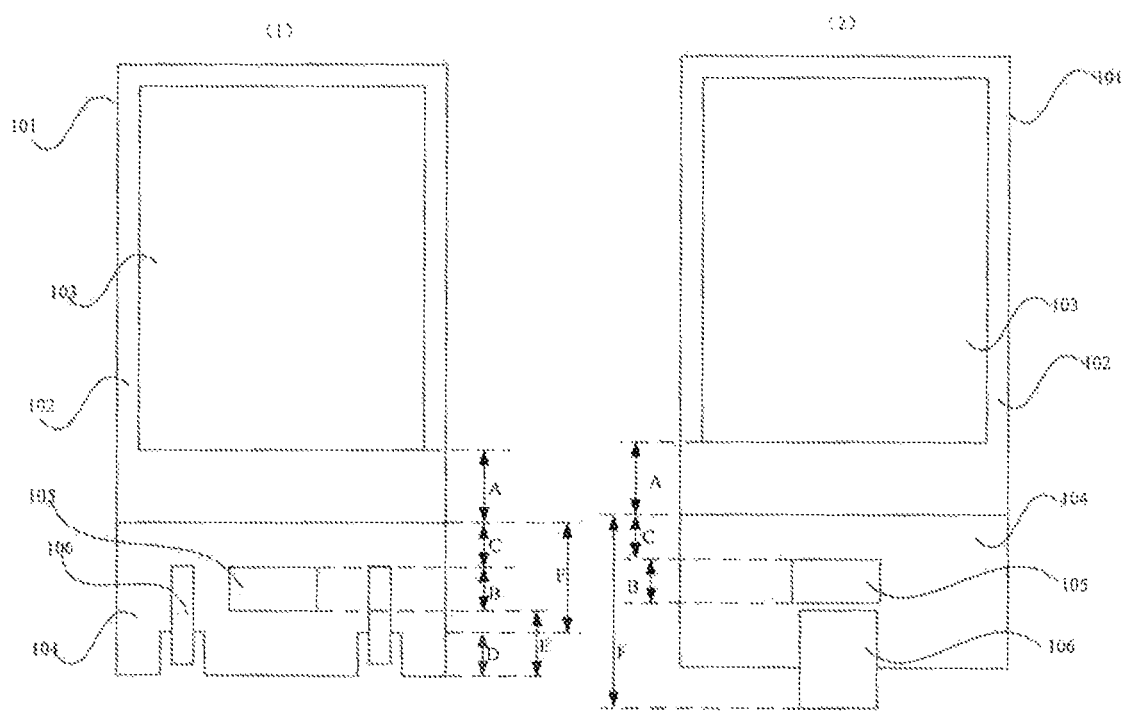
FIG. 4 is schematic views showing differences between a display panel provided by an embodiment of the present disclosure and a conventional display panel.

As shown in FIG. 4, reference numeral (1) denotes a display panel provided by the present disclosure, reference numeral (2) denotes a conventional display panel, and both of them include an array substrate 101, a color filter 102, a display region 103, a driver chip 105, and a flexible circuit board 106. The array substrate 101 includes a non-display region 104. The non-display region 104 includes a distance A between a bottom periphery of the display region 103 and a periphery of the color filter 102, a height B of the driver chip 105, and a distance C between a top periphery of the driver chip 105 and a periphery of the color filter 102. The reference numeral (1) further includes a height D of the protrusion 107, a distance E between a bottom periphery of the driver chip 105 and a periphery of protrusion 107, and a height F between a bottom periphery of the color filter 102 and a periphery of a recess of the non-display region 104. The reference numeral (2) further includes a distance F between a bottom periphery of the color filter 102 and a periphery of the flexible circuit board 106.

In an embodiment of the present disclosure, a total height of the non-display region is the distance A+the distance F+the height D. The distance A is equal to the distance F, a difference between the distance A and the distance F is less than 50 um, and the height D is greater than a difference between the distance B and the distance F. For example, the height D is five to six times the difference between the height B and the distance F, thereby ensuring that the distance C and the distance E are not less than 100 um. Specific setting way is shown in the following table 1:

TABLE 1

|              | A   | B   | C   | D   | E   | F   |
|--------------|-----|-----|-----|-----|-----|-----|
| (1) of FIG. 4 | 700 | 780 | 200 | 400 | 120 | 700 |
| (2) of FIG. 4 | 540 | 780 | 80  | 0   | 0   | 860 |

In table 1, unit of height is micrometers.

Referring to table 1, in the display panel provided by an embodiment of the present disclosure, a height of the protrusion 107 is increased and a driver chip 105 is moved downward. As a result, a height difference A between a bottom periphery of the display region 103 and a periphery of a color filter 102 and a height difference C between a top periphery of the driver chip 105 and a periphery of the color filter 102 are both increased. The distance F between a bottom periphery of the color filter 102 and a periphery of the non-display region 104 is reduced with respect to the conventional display panels. In an embodiment of the present disclosure, a total height of the non-display region 104 and a bending section (in a bending state) of the flexible circuit board 106 is less than that of the conventional display panels, and a height of the non-display region 104 is further reduced.

In one embodiment, to reserve sufficient space to dispose GOA wires, fan-out wires, and terminals, a distance between a side of the driver chip near the display region and a periphery of the display region is designed to be greater than a distance between a side of the first protrusion near the driver chip and a periphery of the first protrusion.

A position of the driver chip can be varied and can be designed as needed.

In one embodiment, the driver chip is disposed in the non-display region and disposed outside the first protrusion.

In one embodiment, the driver chip is completely or partially disposed in the first protrusion.

In one embodiment, shapes of the protrusions 107 may be various. For example. shapes of the protrusions 107 can be one or more of a rectangle, a trapezoid, an arc, and a triangle. All shapes of the protrusions 107 may be the same, may be different, or may be partially the same, which depends on a practical circuit arrangement.

In one embodiment, a shape of the second protrusion, which is defined on a first lateral side, is a rectangle; a shape of the first protrusion, which is defined on a middle portion, is a trapezoid or an arc; and a shape of the second protrusion, which is defined on a second lateral side, is a triangle.

Figure 5:
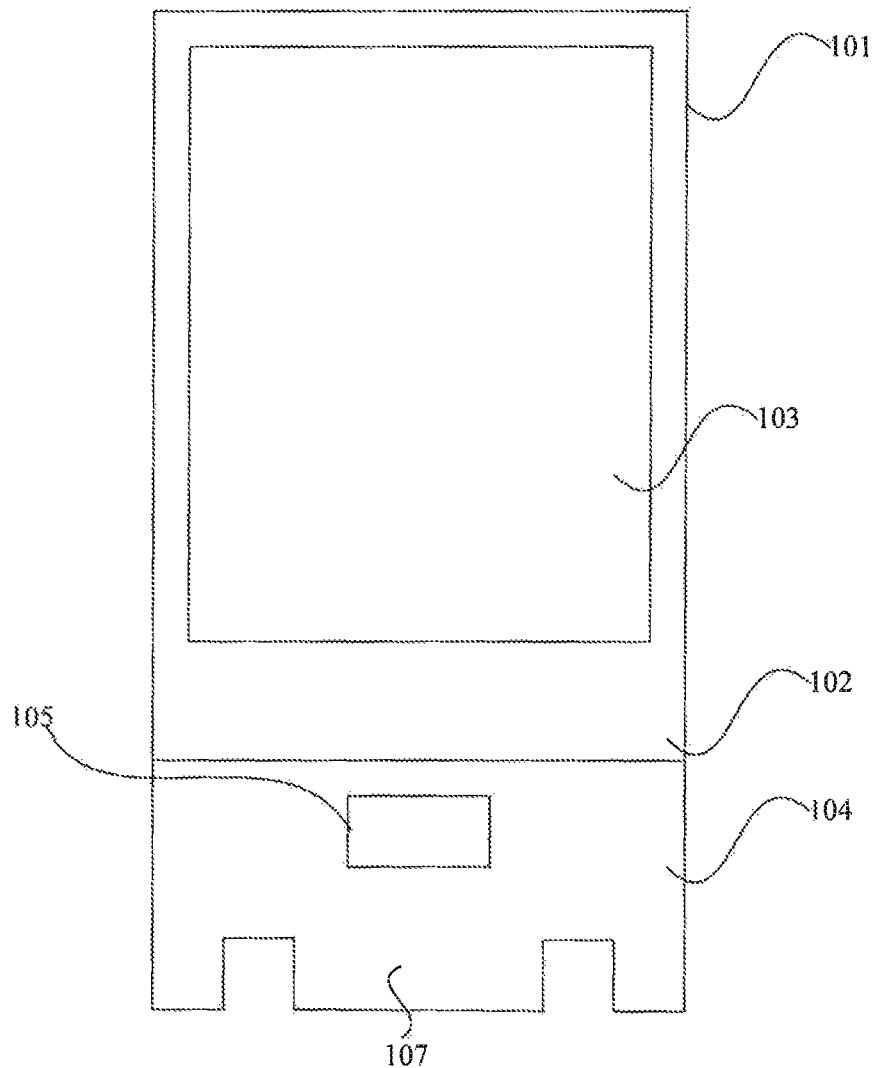
FIG. 5 is a schematic view showing a first protrusion of a display panel according to an embodiment of the present disclosure.

In one embodiment, as shown in FIG. 5, a display panel provided by the present disclosure includes an array substrate 101, a color filter 102, a display region 103, and a protrusion 107 defined on a side of the array substrate 101. A driver chip 105 is disposed in a non-display region 104 of the array substrate 101.

The protrusion 107 includes two short sides symmetrical to each other and connecting a periphery of the non-display region 104. The protrusion 107 further includes along side connecting two short sides. For example, as shown in FIG. 5, the short sides are straight sides and are perpendicular to the periphery of the non-display region 104, and a surface shape of the protrusion 107 is a rectangle.

Figure 6:
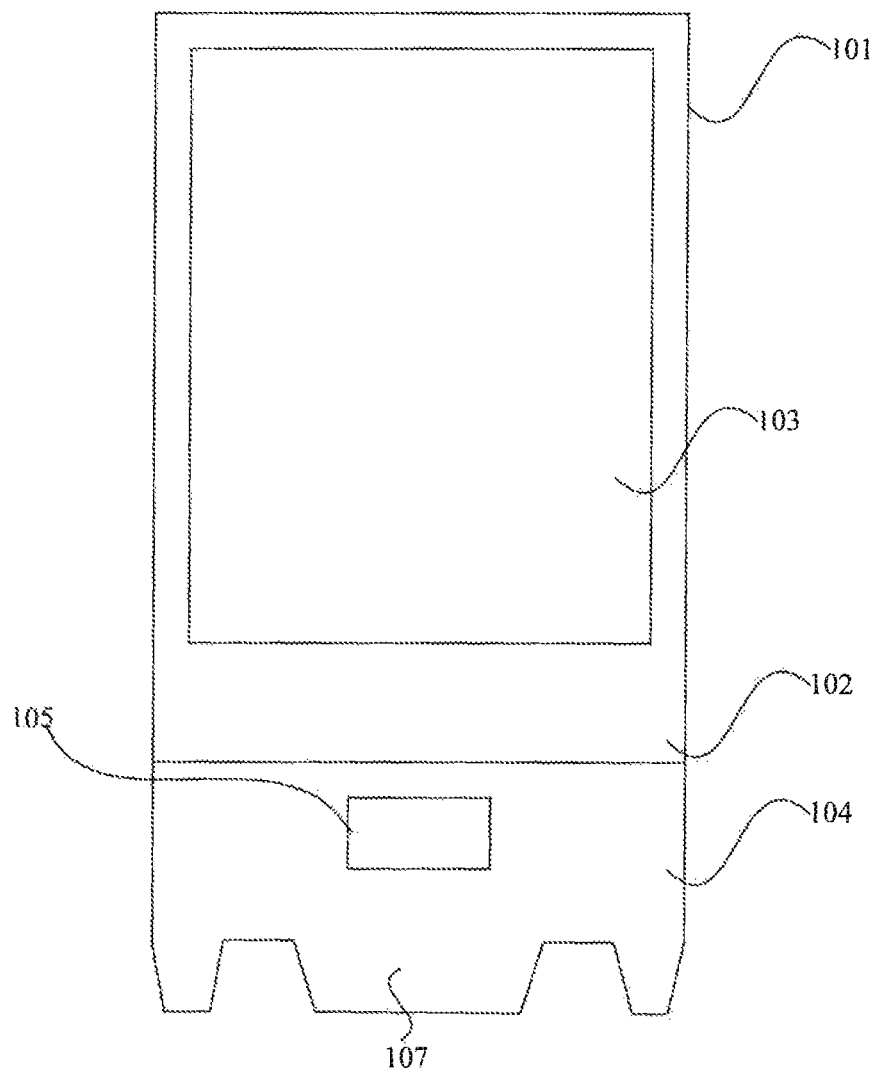
FIG. 6 is a schematic view showing a second protrusion of a display panel according to an embodiment of the present disclosure.

In one embodiment, the protrusion 107 includes two short sides symmetrical to each other and connecting a periphery of the non-display region 104, and the protrusion 107 further includes a long side connecting two short sides. As shown in FIG. 6, differences between the display panel of FIG. 6 and the display panel of FIG. 5 are: the short sides are straight sides, while angles between the short sides and the periphery of the non-display region 104 are not right angles, which means the angles are greater than or less than 90 degrees, and a surface shape of the protrusion 107 is a trapezoid.

Figure 7:
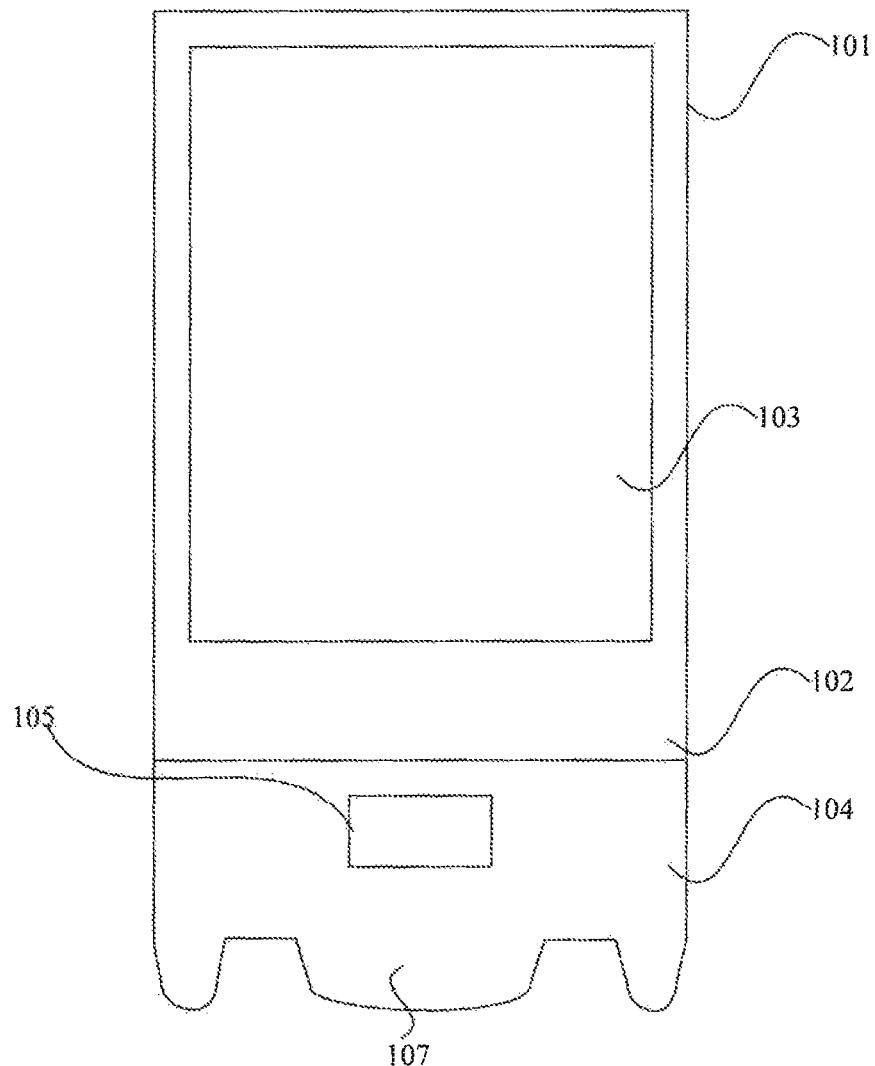
FIG. 7 is a schematic view showing a third protrusion of a display panel according to an embodiment of the present disclosure.

In one embodiment, as shown in FIG. 7, differences between the display panel of FIG. 7, the display panel of FIG. 5, and the display panel of FIG. 6 are: the protrusion 107 includes an outer arc, two ends of the outer arc connect with the periphery of the non-display region 104, and two ends of the outer arc are curved toward an inside of the outer arc.

Figure 8:
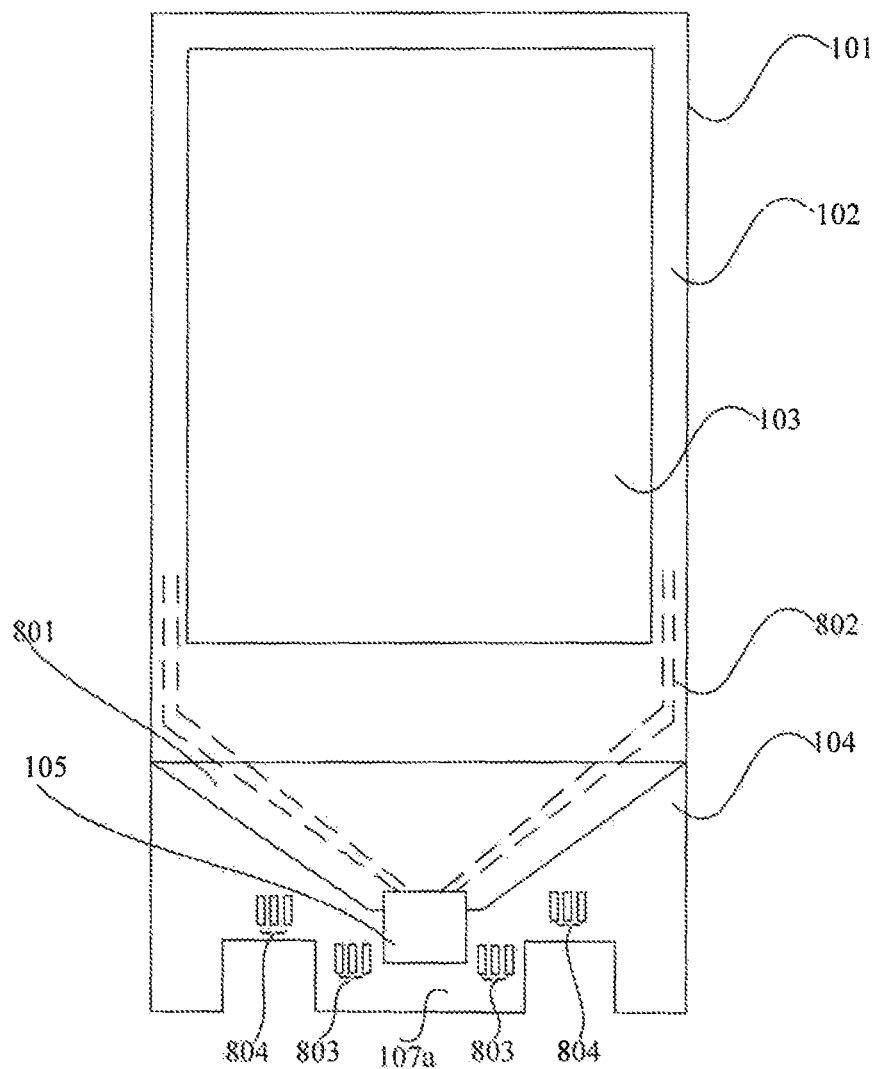
FIG. 8 is a schematic view showing a first terminal of a display panel according to an embodiment of the present disclosure.

A setting way of a flexible circuit board is described as follows:

As shown in FIG. 8, a display panel provided by the present disclosure includes an array substrate 101, a color filter 102, a non-display region 104, a driver chip 105 disposed in the non-display region 104, and a plurality of fan-out wires 801 connecting with the driver chip 105. For example, the fan-out wires 801 are configured to transmit data signals for displaying to the display region 103. At least one GOA wire 802 is disposed in the non-display region 104. Two GOA wires 802, which are symmetrical to each other, are taken as an example. Both of the two GOA wires 802 include a straight section disposed outside the display region 103 and parallel to a periphery of the display region 103, and a tilt section disposed in the non-display region 104 and disposed toward the driver chip 105. The tilt sections of the two GOA wires 802 are connected to the driver chip 105 to input gate signals. The straight sections of the two GOA wires 802 are connected to scan lines of each pixel row to output gate signals.

A plurality of signal terminal groups for connecting the flexible circuit board are disposed in the non-display region 104. Each of the terminal groups at least includes a main signal terminal group 803 and a secondary signal terminal group 804. For example, the main signal group 803 includes pixel data signals and gate signals. The secondary signal terminal group 804 includes power signals. The main signal terminal group 803 is disposed between the secondary terminal group 804 and the driver chip 105 to reduce delay in transmitting signals.

In one embodiment, as shown in FIG. 8, the main signal terminal group 803 is disposed near the driver chip 105. The secondary terminal group 804 is disposed away from the driver chip 105 and the tilt section of the two GOA wires 802. Because the driver chip 105 is moved downward, the tilt sections of the two GOA wires 802, which are connected to the driver chip 105, are moved downward as well, which compresses space where terminals are disposed. If the terminals are too close to the two GOA wires 802, impedance increases, causing signal distortion. As a result, in the present embodiment, at least some of the terminals are disposed away from the two GOA wires 802.

In one embodiment, the secondary signal terminal group 804 is spaced from the main signal terminal group 803. The main signal terminal group 803 is completely or partially disposed in the first protrusion 107a, and the secondary signal terminal group 804 is disposed outside the protrusion 107a, thereby effectively controlling a distance between the terminals and the two GOA wires 802 to reduce impedance.

Figure 9:
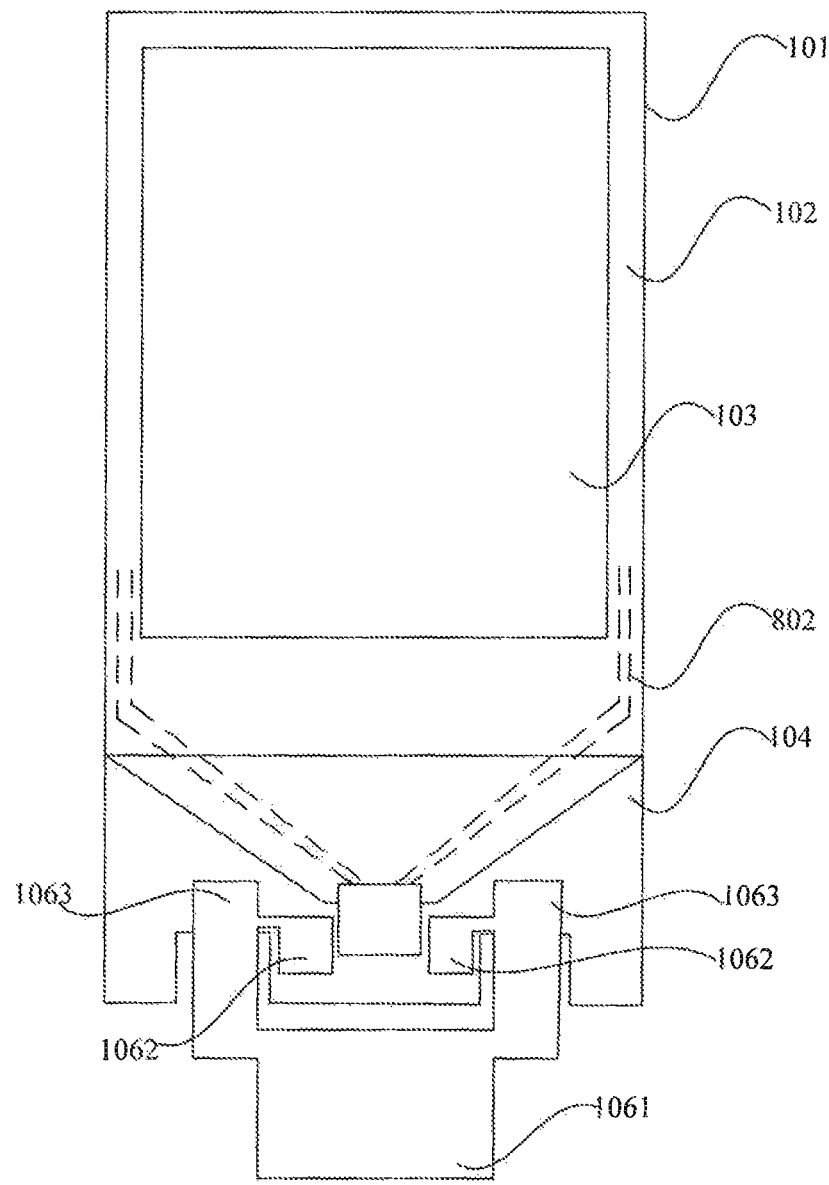
FIG. 9 is a schematic view showing a first flexible circuit board of a display panel according to an embodiment of the present disclosure.

As shown in FIG. 9, the flexible circuit board includes a main section 1061 and a connecting section configured to connect with the signal terminal groups. The connecting section includes a first block 1062 correspondingly connected to the main signal terminal group 803 and a second block 1063 correspondingly connected to the secondary signal terminal group 804. The first block 1062 and the second block 1063 are disposed alternatively.

Figure 10:
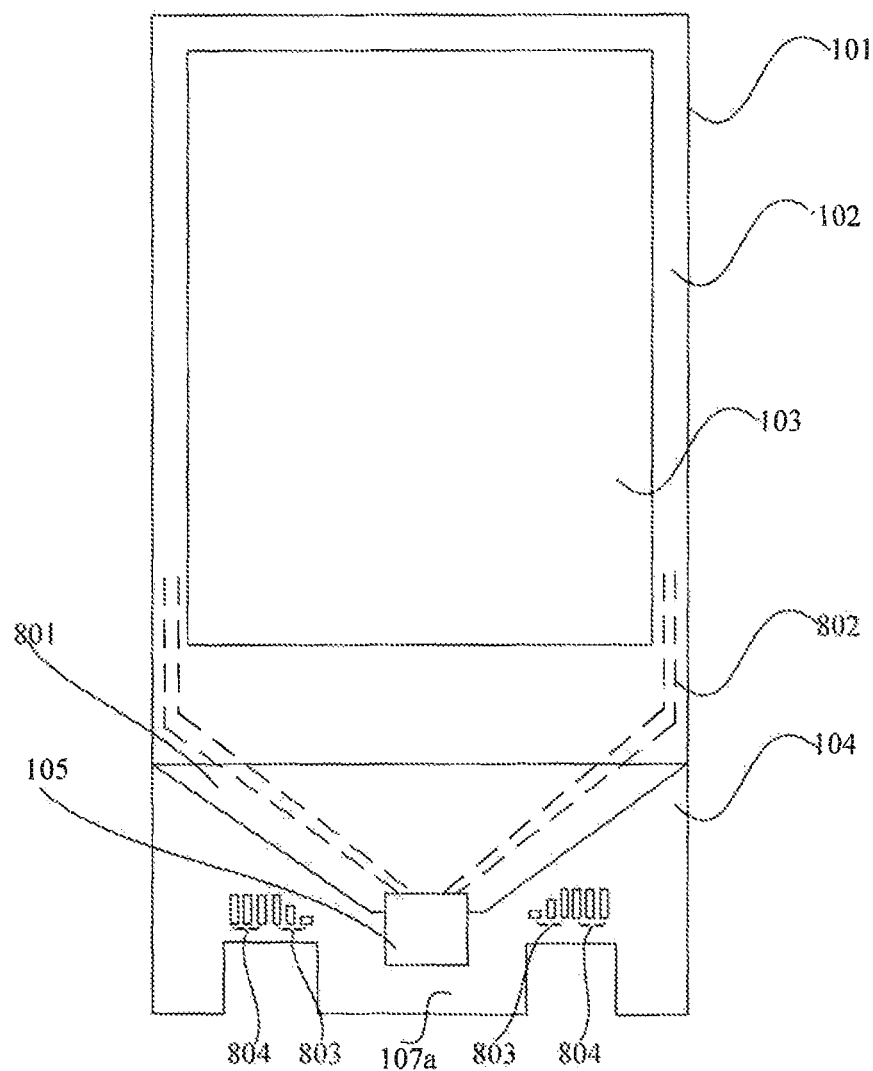
FIG. 10 is a schematic view showing a second terminal of a display panel according to an embodiment of the present disclosure.

As shown in FIG. 10, compared to the setting way of signal terminals in FIG. 8, the terminals are arranged tightly. The main signal terminal group 803 and the secondary signal terminal group 804 are disposed outside the first protrusion 107a, thereby preventing space of the first protrusion 107a from being compressed. Area of each of the terminals of the main signal terminal group 803 and area of each of the terminals of the secondary signal terminal group 804 are the same, thereby ensuring that signal contact points can be connected stably.

In one embodiment, a height of each of the terminals of the main signal terminal group 4071 is less than a height of each of the terminals of the secondary terminal group 4072. Furthermore, a width of each of the terminals of the main signal terminal group 4071 is greater than a width of each of the terminals of the secondary signal terminal group 4072. By reducing the height of the terminals near the two GOA wires 802 to maintain a distance between the terminals and the two GOA wires 802, impedance between the terminals and the two GOA wires 802 can be reduced.

In one embodiment, a height of each of the terminals of the main signal terminal group 803 progressively decreases from the terminals away from the driver chip 105 and the tilt sections of the two GOA wires 802 to the terminals near the driver chip 105 and the tilt sections of the two GOA wires 802. Furthermore, a width of each of the terminals of the main signal terminal group 803 progressively increases from the terminals away from the driver chip 105 and the tilt sections of the two GOA wires 802 to the terminals near the driver chip 105 and the tilt sections of the two GOA wires 802, thereby ensuring that distances between each of the terminals and the two GOA wires 802 are the same.

Figure 11:
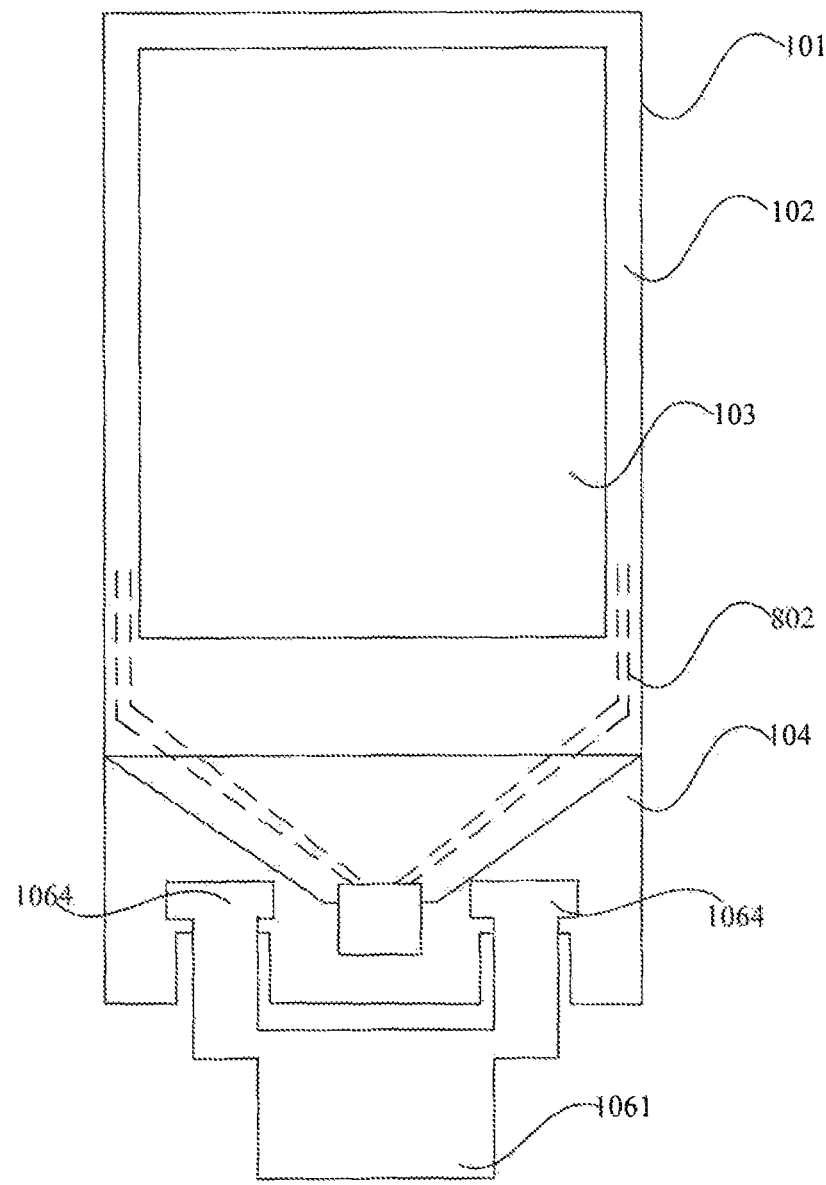
FIG. 11 is a schematic view showing a second flexible circuit board of a display panel according to an embodiment of the present disclosure.

As shown in FIG. 11, the flexible circuit board includes a main section 1061 and a connecting section 1064 configured to connect with the signal terminal groups. Ends of the connecting section 1064 are a regular geometric shape. The ends of the connecting section 1064 include a first connecting area and a second connecting area. The first connecting area covers and connects with the main signal terminal group. The second connecting area covers and connects with the secondary signal terminal group.

In one embodiment, each of the signal terminal groups further includes a virtual terminal group. The virtual terminal group is disposed on a side of the secondary signal terminal group 4072 away from the driver chip 105 and the tilt section of the GOA wire 802 Terminals of the virtual terminal group do not transmit signal, but are configured to enlarge binding area between a panel and the flexible circuit board to enhance connection effect, thereby supporting the flexible circuit board and ensuring flatness of the panel.

Figure 12:
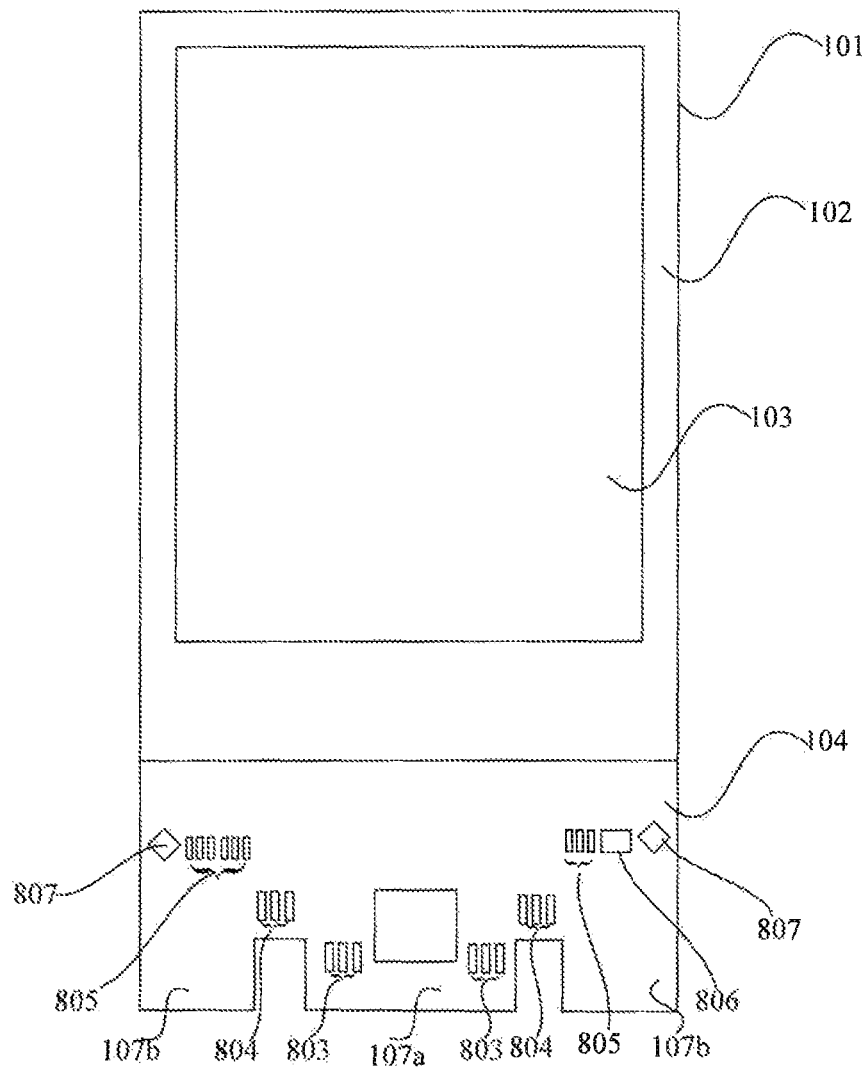
FIG. 12 is a schematic view showing a third terminal of a display panel according to an embodiment of the present disclosure.

A setting way of circuit on a second protrusion is described as follows:

In one embodiment, as shown in FIG. 12, a display panel provided by the present disclosure includes an array substrate 101, a color filter 102, a non-display region 104 disposed on the array substrate 101, a testing terminal group 805 disposed in the non-display region 104, a converting terminal group 806, and an identification terminal group 807. At least one of the testing terminal group 805, the converting terminal group 806, or the identification terminal group 807 is disposed between a periphery of a second protrusion 107b and a periphery of the display region 103.

The testing terminal group 805, the converting terminal group 806, and the identification terminal group 807 may be disposed between the periphery of the second protrusion 107b and the periphery of the display region 103 in a same row, or can be disposed between the periphery of the second protrusion 107b and the periphery of the display region 103 in different rows.

Figure 13:
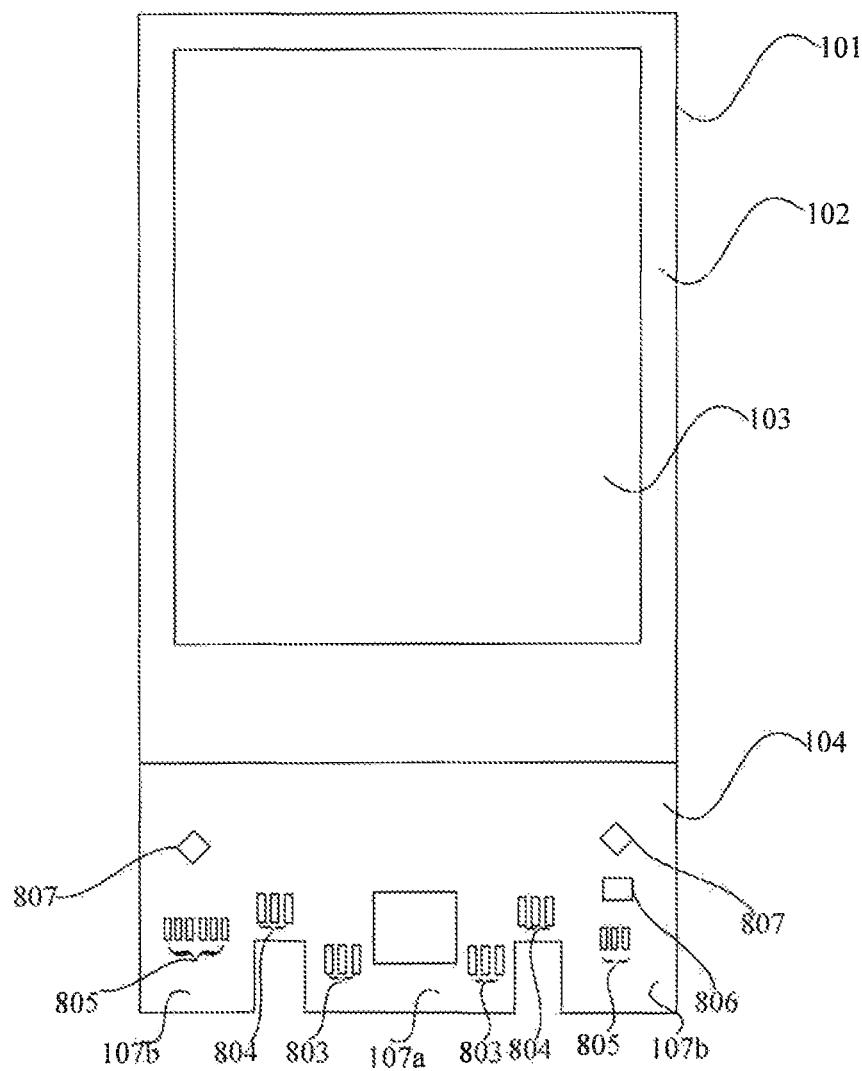
FIG. 13 is a schematic view showing a fourth terminal of a display panel according to an embodiment of the present disclosure.

In one embodiment, to enlarge gaps between the testing terminal group 805, the converting terminal group 806, and the identification terminal group 807, as shown in FIG. 13, in a display provided by the present embodiment, the testing terminal group 805, the converting terminal group 806, and the identification terminal group 807 are disposed in at least two rows.

The testing terminal group 805 is configured to test performance of the display panel by inputting testing signals into terminals of the testing terminal group 805 after the display panel is formed from the array substrate. A silver conductive adhesive is coated on the converting terminal group 806. The silver conductive adhesive is configured to connect a ground wire (not shown) in the non-display region 101 of the array substrate with a conductive layer of a color filter corresponding to the array substrate of the display panel, thereby preventing static electricity. Terminals of the identification terminal group 807 are configured to record information about the array substrate and are configured to align the array substrate.

In one embodiment, the present disclosure further provides a display device. The display device includes a display panel. The display panel includes an array substrate, a display region disposed on a surface of the array substrate, and a non-display region formed on a region where the array substrate does not cover. A driver chip and a flexible circuit board are bonded to the non-display region. A plurality of protrusions are defined on a side of the non-display region away from the display region. A recess is defined in adjacent protrusions. Each of the protrusions includes at least one first protrusion and at least one second protrusion. The driver chip is disposed between a periphery of the first protrusion and a periphery of the display region.

Partial section of the flexible circuit board is bent to a backside of the array substrate with respect to a periphery of the recess beside at least one side of the first protrusion.

In one embodiment, in the display device, a distance between a side of the driver chip near the display region and a periphery of the display region is greater than a distance between a side of the first protrusion near the driver chip and a periphery of the first protrusion.

In one embodiment, in the display device, the driver chip is disposed outside the first protrusion, or the driver chip is completely or partially disposed in the first protrusion.

In one embodiment, in the display device, the protrusion includes two short sides symmetrical to each other and connecting a periphery of the non-display region. The protrusion further includes a long side connecting two short sides. The short sides are perpendicular to the periphery of the non-display region, or angles between the short sides and the periphery of the non-display region are not right angles.

In one embodiment, in the display device, the protrusion includes an outer arc. Two ends of the outer arc connect with the periphery of the non-display region. Two ends of the outer arc are curved toward an inside of the outer arc.

In one embodiment, in the display device, a GOA wire is disposed in the array substrate. The GOA wire includes a tilt section located in the non-display region and toward the driver chip. The tilt section of the GOA wire is connected to the driver chip. A plurality of signal terminal groups are disposed in the non-display region and are configured to connect with the flexible circuit board. The signal terminal groups include a main signal terminal group and a secondary terminal group. The main signal terminal group is disposed between the secondary terminal group and the driver chip.

In one embodiment, in the display device, the secondary signal terminal group and the main signal terminal group are spaced from each other. The main signal terminal group is completely or partially disposed in the first protrusion. The secondary signal terminal group is disposed outside the first protrusion.

In one embodiment, in the display device, the flexible circuit board includes a main section and a connecting section. The connecting section includes a first block correspondingly connected to the main signal terminal group and a second block correspondingly connected to the secondary signal terminal group. The first block and the second block are disposed alternatively.

In one embodiment, in the display device, a virtual terminal group is disposed in the non-display region. The virtual terminal group is disposed on a side of the secondary signal terminal group away from the driver chip and the tilt section of the GOA wire.

In one embodiment, in the display device, the non-display region further includes a testing terminal group, a converting terminal group, and an identification terminal group. At least one of the testing terminal group, the converting terminal group, or the identification terminal group is disposed between an edge of the second protrusion and an edge of the display region.

In the display panel provided by an embodiment of the present disclosure, the testing terminal group, the converting terminal group, and the identification terminal group are disposed in at least two rows.

According to the Above Embodiments

The present disclosure provides a display panel and a display device; in an array substrate of the display panel, at least two protrusions are defined on a side of a non-display region away from a display region to form an extending portion. A recess is defined between adjacent protrusions. Compared to conventional display panels, in the display panel provided by the present disclosure, a driver chip is disposed in a space between a periphery of a display region and a periphery of a non-display region. Distances between the driver chip, the periphery of the display region, and the periphery of the non-display region are increased, which prevent technical defects following a pressing process of the driver chip, such as poor electrical property of the driver chip and improperly sealed liquid crystal cell, which are caused by the driver chip being excessively close to the periphery of the display region and a periphery of a substrate due to a compression of the non-display region in a high screen-to-body ratio display panel. Furthermore, a bending section of a flexible circuit board is disposed in the recess between two adjacent protrusions. A bending radius of the bending section does not overstep peripheries of the protrusions. As a result, width of the non-display region will not be increased, body-to-screen ratio of a display device can be kept, and a technical problem that conventional display panels cannot meet a developing trend of full-screen display technology can be alleviated.

To sum up, the present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
    an array substrate;
    a driver chip; and
    a flexible circuit board;
    wherein the array substrate comprises a display region and a non-display region;
    wherein the driver chip and the flexible circuit board are bonded to a side of the non-display region;
    wherein at least two protrusions are defined on a side of the non-display region away from the display region, and a recess is defined between adjacent protrusions; and
    wherein a partial section of the flexible circuit board is bent to a backside of the array substrate along an edge of the recess, and the driver chip is deposed between an edge of the non-display region and an edge of the display region.

2. The display panel of claim 1, wherein each of the protrusions comprises at least one first protrusion and at least one second protrusion; and
    wherein the driver chip is disposed between an edge of the first protrusion and the edge of the display region.

3. The display panel of claim 2, wherein the driver chip is disposed outside the first protrusion; or
    wherein the driver chip is completely or partially disposed in the first protrusion.

4. The display panel of claim 1, wherein shapes of the protrusions comprise one or more of a rectangle, a trapezoid, a circular arc, or a triangle.

5. The display panel of claim 1, wherein a gate driver on array (GOA) wire is disposed in the array substrate, the GOA wire comprises a tilt section located in the non-display region and toward the driver chip, and the tilt section of the GOA wire is connected to the driver chip; and
    wherein a plurality of signal terminal groups are disposed in the non-display region and are configured to connect with the flexible circuit board.

6. The display panel of claim 5, wherein each of the signal terminal groups comprises a main signal terminal group and a secondary signal terminal group; and
    wherein the main signal terminal group is disposed between the secondary signal terminal group and the driver chip.

7. The display panel of claim 6, wherein the secondary signal terminal group and the main signal terminal group are spaced from each other, the main signal terminal group is completely or partially disposed in the first protrusion, and the secondary signal terminal group is disposed outside the first protrusion.

8. The display panel of claim 7, wherein the flexible circuit board comprises a main section and a connecting section;
    wherein the connecting section comprises a first block correspondingly connected to the main signal terminal group and a second block correspondingly connected to the secondary signal terminal group; and
    wherein the first block and the second block are disposed alternatively.

9. The display panel of claim 6, wherein each of the signal terminal groups further comprises a virtual terminal group; and
    wherein the virtual terminal group is disposed on a side of the secondary signal terminal group away from the driver chip and the tilt section of the GOA wire.

10. The display panel of claim 1, wherein the non-display region further comprises a testing terminal group, a converting terminal group, and an identification terminal group; and
    wherein at least one of the testing terminal group, the converting terminal group, or the identification terminal group is disposed between an edge of the second protrusion and an edge of the display region.

11. The display panel of claim 10, wherein the testing terminal group, the converting terminal group, and the identification terminal group are disposed in at least two rows.

12. A display device, comprising:
    an array substrate;
    a driver chip; and
    a flexible circuit board;
    wherein the array substrate comprises a display region and a non-display region;
    wherein the driver chip and the flexible circuit board are bonded to a side of the non-display region;
    wherein at least two protrusions are defined on a side of the non-display region away from the display region, and a recess is defined between two adjacent protrusions; and
    wherein a partial section of the flexible circuit board is bent to a backside of the array substrate along an edge of the recess, and the driver chip is deposed between an edge of the non-display region and an edge of the display region.

13. The display device of claim 12, wherein each of the protrusions comprises at least one first protrusion and at least one second protrusion; and wherein the driver chip is disposed between an edge of the first protrusion and the edge of the display region.

14. The display device of claim 13, wherein the driver chip is disposed outside the first protrusion; or wherein the driver chip is completely or partially disposed in the first protrusion.

15. The display device of claim 12, wherein shapes of the protrusions comprise one or more of a rectangle, a trapezoid, a circular arc, or a triangle.

16. The display device of claim 12, wherein a gate driver on array (GOA) wire is disposed in the array substrate, the GOA wire comprises a tilt section located in the non-display region and toward the driver chip;

wherein the tilt section of the GOA wire is connected to the driver chip; and wherein a plurality of signal terminal groups are disposed on the non-display region and are configured to connect with the flexible circuit board.

17. The display device of claim 16, wherein each of the signal terminal groups comprises a main signal terminal group and a secondary signal terminal group; and wherein the main signal terminal group is disposed between the secondary signal terminal group and the driver chip.

18. The display device of claim 17, wherein the secondary signal terminal group and the main signal terminal group are spaced from each other, the main signal terminal group is completely or partially disposed in the first protrusion, and the secondary signal terminal group is disposed outside the first protrusion.

19. The display device of claim 18, wherein the flexible circuit board comprises a main section and a connecting section;

wherein the connecting section comprises a first block correspondingly connected to the main signal terminal group and a second block correspondingly connected to the secondary signal terminal group; and wherein the first block and the second block are disposed alternatively.

20. The display device of claim 17, wherein each of the signal terminal groups further comprises a virtual terminal group, and wherein the virtual terminal group is disposed on a side of the secondary signal terminal group away from the driver chip and the tilt section of the GOA wire.

* * * * *